(12) United States Patent
Yasooka

(10) Patent No.: US 8,130,513 B2
(45) Date of Patent: Mar. 6, 2012

(54) RADIO-FREQUENCY PACKAGE

(75) Inventor: Kousuke Yasooka, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 216 days.

(21) Appl. No.: 12/519,861

(22) PCT Filed: Feb. 26, 2008

(86) PCT No.: PCT/JP2008/053292
§ 371 (c)(1),
(2), (4) Date: Jun. 18, 2009

(87) PCT Pub. No.: WO2008/111391
PCT Pub. Date: Sep. 18, 2008

(65) Prior Publication Data
US 2010/0046184 A1 Feb. 25, 2010

(30) Foreign Application Priority Data
Mar. 14, 2007 (JP) ................................. 2007-065475

(51) Int. Cl.
*H05K 1/11* (2006.01)
(52) U.S. Cl. ........ 361/795; 361/309; 361/760; 361/764; 361/794; 333/26; 333/204; 333/247; 257/659; 257/664; 257/691; 257/701; 257/728; 342/109; 342/175
(58) Field of Classification Search .............. 361/795, 361/309, 760, 764, 794; 333/26, 204, 247; 257/704, 659, 691, 728, 664; 342/109, 175
See application file for complete search history.

(56) References Cited

U.S. PATENT DOCUMENTS

| | | | |
|---|---|---|---|
| 5,045,820 A * | 9/1991 | Leicht et al. ..................... 333/26 |
| 5,418,329 A | 5/1995 | Katoh et al. | |
| 6,885,563 B2 * | 4/2005 | Panella et al. ................. 361/794 |
| 6,888,235 B2 * | 5/2005 | Lopata et al. ................. 257/691 |
| 6,989,726 B2 * | 1/2006 | Amano ......................... 333/204 |
| 7,504,710 B2 * | 3/2009 | Suzuki ......................... 257/659 |
| 2003/0024633 A1 * | 2/2003 | Ogura et al. .................. 156/250 |
| 2003/0231078 A1 * | 12/2003 | Koriyama et al. ............... 333/26 |
| 2004/0085164 A1 * | 5/2004 | Hirabayashi .................. 333/204 |

(Continued)

FOREIGN PATENT DOCUMENTS
CN 1462088 A 12/2003
(Continued)

OTHER PUBLICATIONS

Office Action issue Sep. 27, 2011, in Japanese Patent Application No. 2009-503955 with partial English translation.

*Primary Examiner* — Xiaoliang Chen
(74) *Attorney, Agent, or Firm* — Oblon, Spivak, McClelland, Maier & Neustadt, L.L.P.

(57) ABSTRACT

A radio-frequency package includes a radio-frequency device, a multilayer dielectric substrate, and an electromagnetic shield member. The multilayer dielectric substrate includes an internal conductor pad, a first signal via-hole connected to the internal conductor pad, an external conductor pad, a second signal via-hole connected to the external conductor pad, and an inner-layer signal line that connects between the first signal via-hole and the second signal via-hole. The internal conductor pad includes a leading-end open line having a length of substantially a quarter of a wavelength of a radio-frequency signal used in the radio-frequency device.

3 Claims, 5 Drawing Sheets

U.S. PATENT DOCUMENTS

| | | | |
|---|---|---|---|
| 2004/0090266 A1* | 5/2004 | Sakai et al. | 330/129 |
| 2004/0155723 A1* | 8/2004 | Koriyama | 333/26 |
| 2004/0257174 A1* | 12/2004 | Amano | 333/204 |
| 2005/0017824 A1* | 1/2005 | Hirabayashi | 333/204 |
| 2005/0190017 A1* | 9/2005 | Hirabayashi | 333/204 |
| 2005/0248909 A1* | 11/2005 | Kikuchi et al. | 361/309 |
| 2007/0040735 A1* | 2/2007 | Matsuo et al. | 342/175 |
| 2007/0200204 A1* | 8/2007 | Suzuki et al. | 257/664 |
| 2007/0262836 A1* | 11/2007 | Voss | 333/247 |
| 2007/0273008 A1* | 11/2007 | Suzuki | 257/659 |
| 2008/0042773 A1* | 2/2008 | Koriyama | 333/26 |
| 2008/0074204 A1* | 3/2008 | Ichikawa et al. | 331/67 |
| 2009/0079648 A1* | 3/2009 | Matsuo et al. | 343/771 |

FOREIGN PATENT DOCUMENTS

| | | |
|---|---|---|
| EP | 1 729 340 A1 | 12/2006 |
| JP | 4 186645 | 7/1992 |
| JP | 4 363901 | 12/1992 |
| JP | 6-181266 | 6/1994 |
| JP | 10 224119 | 8/1998 |
| JP | 2000 31712 | 1/2000 |
| JP | 2005 101856 | 4/2005 |

* cited by examiner

RADIO-FREQUENCY PACKAGE

TECHNICAL FIELD

The present invention relates to a radio-frequency package equipped with a radio-frequency device that operates in a radio-frequency band such as a microwave band or a millimeter-wave band, and more particularly, to a radio-frequency package capable of suppressing a leakage (spurious) of a radio-frequency signal from a radio-frequency device to the outside.

BACKGROUND ART

An automotive millimeter-wave radar that detects a distance and a relative speed to a vehicle in front by the use of an electromagnetic wave in a millimeter-wave band is applied to a cruise control and safety measures, for example, for reducing damage to a driver in case a vehicle collision is inevitable. In such an automotive millimeter-wave radar, to achieve a transmission signal, a method of multiplying a low frequency is mostly employed. However, in this case, lots of frequency components exist in a module, so that it is extremely difficult to meet overseas EMI standards (such as the FCC).

In an automotive millimeter-wave radar, a radar module generally includes a radio-frequency package equipped with a radio-frequency device for a radar device, a control/interface substrate that supplies a bias signal and a control signal to the radio-frequency package, a waveguide plate, and the like. To meet the EMI standards, in conventional technologies, the entire radar module is generally covered with a metal cover.

However, when the entire radar module is covered with the metal cover, it is necessary to provide an expensive enclosure and the like. Therefore, to achieve a low cost, there has been expected to develop a countermeasure meeting the EMI standards within the radio-frequency package.

In a technology disclosed in Patent document 1, an integrated-circuit component for radio-frequency signal and a dielectric substrate are mounted on a metallic base member, and a microstrip line is formed on the dielectric substrate. The base member on which the integrated-circuit component for radio-frequency signal and the dielectric substrate are mounted is covered with a metallic frame member and a metallic cover member. The integrated-circuit component for radio-frequency signal mounted on the base member is supplied with a bias via a bias terminal.

Patent document 1: Japanese Patent Application Laid-open No. 2000-31712

DISCLOSURE OF INVENTION

Problem to be Solved by the Invention

In the above conventional technology, a radio-frequency package is enclosed by the metal base, the metallic frame member, and the metallic cover member, so that leakage of a radio-frequency component to the outside is suppressed to some degree. However, any countermeasures against a radio-frequency component leaking through the bias terminal are not taken. Therefore, there is a problem that the radio-frequency component as a spurious that is electromagnetically coupled to the bias terminal in a radio-frequency package is radiated to the outside through the bias terminal.

Namely, in this kind of radio-frequency package, a radio-frequency device is mounted on a surface layer of a multilayer dielectric, and a portion of the surface layer of the multilayer dielectric substrate and the radio-frequency device are covered with an electromagnetic shield member. To supply a bias voltage or a control signal from the outside to the radio-frequency device covered with the electromagnetic shield member, an external terminal arranged outside the electromagnetic shield member is connected to an internal terminal inside the electromagnetic shield member through a signal via-hole, an inner-layer signal line, and a signal via-hole in the multilayer dielectric substrate, and the internal terminal is further electrically-connected to the radio-frequency device via a wire. Therefore, the conventional radio-frequency package has a problem that spurious emission propagating through an internal space formed by the electromagnetic shield member is coupled to the wire, and radiated to the outside through a bias line provided in an inner layer of the dielectric substrate.

The present invention has been made in view of the above problems, and an object of the present invention is to provide a radio-frequency package with a high radio-frequency shielding performance at low cost by reducing a level of spurious coupled to a wire and thereby suppressing a level of spurious emission to the outside within the radio-frequency package.

Means for Solving Problem

To solve the above problems and to achieve the object, a radio-frequency package according to the present invention includes a radio-frequency device, a multilayer dielectric substrate having a surface layer on which the radio-frequency device is mounted, and an electromagnetic shield member that covers a portion of the surface layer of the multilayer dielectric substrate and the radio-frequency device. The multilayer dielectric substrate includes an internal conductor pad for bias/control signal arranged on the surface layer of the multilayer dielectric substrate inside the electromagnetic shield member and wire-connected to the radio-frequency device, a first signal via-hole connected to the internal conductor pad and arranged inside the electromagnetic shield member, an external conductor pad for bias/control signal arranged outside the electromagnetic shield member, a second signal via-hole connected to the external conductor pad and arranged outside the electromagnetic shield member, and an inner-layer signal line that connects between the first signal via-hole and the second signal via-hole. The internal conductor pad includes a leading-end open line having a length of substantially a quarter of a wavelength of a radio-frequency signal used in the radio-frequency device.

EFFECT OF THE INVENTION

According to the present invention, a leading-end open line having a length equivalent to substantially a quarter of a wavelength of a radio-frequency signal (spurious) used in a radio-frequency device is provided to an internal conductor pad for bias/control signal. The spurious coupled to a wire is reflected by the leading-end open line provided to the internal conductor pad. Therefore, it is possible to reduce a level of spurious coupled to the wire, and thus it is possible to reduce a level of spurious leaking to the outside. Consequently, it is possible to suppress leakage of spurious to outside a radio-frequency package reliably. In this manner, within the radio-frequency package, leakage of a radio-frequency component to outside the radio-frequency package can be suppressed, reducing a production cost.

Figure 1:
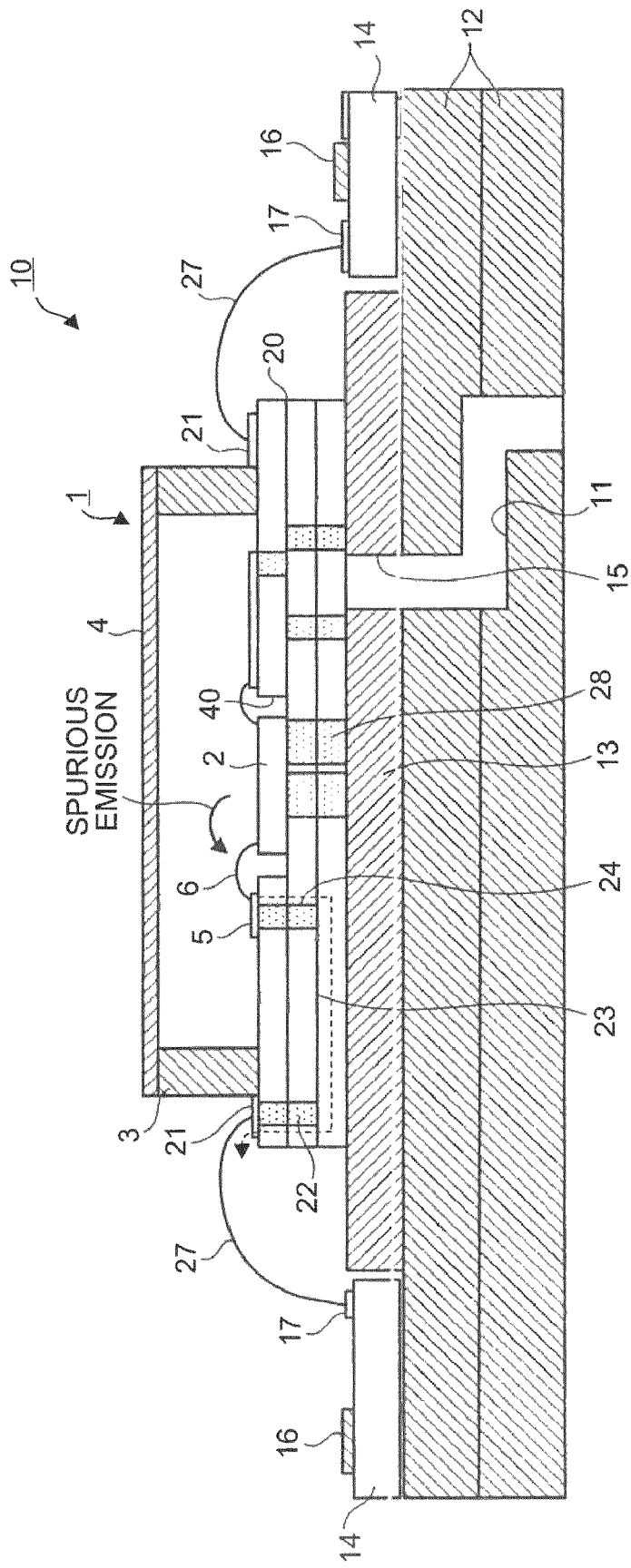
FIG. 1 is a cross-sectional view illustrating a configuration of a transmitter/receiver module in which a radio-frequency package according to an embodiment of the present invention is mounted.

EXPLANATIONS OF LETTERS OR NUMERALS 1 radio-frequency package
2 radio-frequency device
3 seal ring
4 cover
5 internal conductor pad
6 wire
7 conductor pad
10 transmitter/receiver module
11 waveguide
12 waveguide plate
13 carrier substrate
14 module control substrate
15 waveguide
16 electronic circuit
17 external terminal
20 multilayer dielectric substrate
21 external conductor pad
22, 24 signal via-hole
23 inner-layer signal line
27 wire
28 ground via-hole
40 concave portion
50 leading-end open line

BEST MODE(S) FOR CARRYING OUT THE INVENTION

Exemplary embodiments of a radio-frequency package according to the present invention are explained in detail below with reference to the accompanying drawings. Incidentally, the present invention is not limited to the embodiments.

Figure 2:
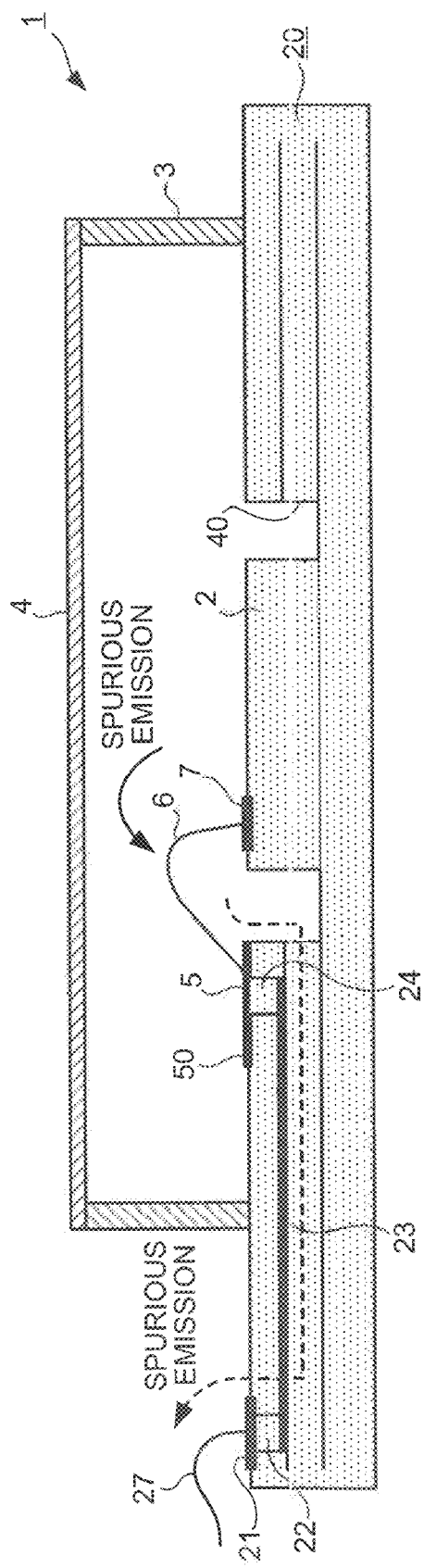
FIG. 2 is a cross-sectional view illustrating a configuration example of the radio-frequency package according to the embodiment of the present invention.

FIG. 1 is a cross-sectional view illustrating a configuration of a transmitter/receiver module 10 in which a radio-frequency package 1 is mounted. FIG. 2 is a cross-sectional view illustrating a configuration of the radio-frequency package 1. The transmitter/receiver module 10 is applied, for example, to an FM-CW radar having a function of detecting a distance and a relative speed to a target (such as a vehicle) in front by the use of an electromagnetic wave in a millimeter-wave band. The FM-CW radar irradiates the target with a frequency-modulated radio-frequency signal (a transmitted signal), detects a difference in frequency between a signal reflected from the target (a received signal) and the transmitted signal, and calculates a distance and a relative speed to the target based on the frequencies.

The transmitter/receiver module 10 includes a waveguide plate 12 in which a waveguide 11 is formed, a metallic carrier substrate 13 that is mounted on the waveguide plate 12, the radio-frequency package 1 that is mounted on the carrier substrate 13, and a module control substrate (also referred to as a control/interface substrate) 14 that is mounted on the waveguide plate 12. An antenna substrate (not shown) is connected to the underside of the waveguide plate 12. The carrier substrate 13 is grounded, and a waveguide 15 is formed in the carrier substrate 13. On the module control substrate 14, an electronic circuit 16, which composes a control circuit, a power circuit, and the like, an external terminal 17, and the like are mounted. On the carrier substrate 13, a multilayer dielectric substrate 20 as a component of the radio-frequency package 1 is mounted. A concave portion 40 for mounting therein a radio-frequency device 2 is formed on the center of a surface layer of the multilayer dielectric substrate 20.

The radio-frequency device (MMIC) 2 is put on a bottom surface of the concave portion 40 so as to be housed in the concave portion 40 formed on the multilayer dielectric substrate 20. A metallic frame-like seal ring 3 is mounted on the multilayer dielectric substrate 20 to shield spurious emission from the radio-frequency device 2 to the outside. A metallic cover 4 is provided on the seal ring 3. The seal ring 3 and the cover 4 compose an electromagnetic shield member that covers a portion of the surface layer of the multilayer dielectric substrate 20 and the radio-frequency device 2. Namely, the radio-frequency device 2 is housed in a cavity that is enclosed by the multilayer dielectric substrate 20, the seal ring 3, and the cover 4 thereby being blocked off from the outside. As described above, the radio-frequency package 1 is composed of the multilayer dielectric substrate 20, the radio-frequency device 2, the seal ring 3, the cover 4, and the like.

Furthermore, an internal conductor pad (also referred to as a pad for bias/control signal) 5 for supplying a bias voltage to the radio-frequency device 2 or inputting/outputting a control signal from/to the radio-frequency device 2 is provided on the surface layer of the multilayer dielectric substrate 20 inside the electromagnetic shield member. A conductor pad 7 is provided on the radio-frequency device 2. The internal conductor pad 5 and the conductor pad 7 on the radio-frequency device 2 are connected to each other by a wire 6 made of gold or the like, i.e., by wire bonding.

An external conductor pad (an external terminal) 21 is provided on the multilayer dielectric substrate 20 outside the electromagnetic shield member. The external conductor pad 21 is electrically connected to the internal conductor pad 5 via a signal via-hole 22 formed in the multilayer dielectric substrate 20 outside the seal ring 3, an inner-layer signal line 23, and a signal via-hole 24 formed in the multilayer dielectric substrate 20 inside the seal ring 3. The external conductor pad 21 is, as shown in FIG. 1, connected to the external terminal 17 formed on the module control substrate 14 via a wire 27. By such a connection configuration, a bias voltage or a control signal can be supplied from the module control substrate 14 arranged outside the seal ring 3 to the radio-frequency device 2 arranged inside the seal ring 3.

Incidentally, inside the seal ring 3, basically, a ground pattern as a surface-layer grounding conductor is formed on the surface layer of the multilayer dielectric substrate 20 except for a portion where dielectrics around the internal conductor pad 5 are exposed, and thereby preventing a radio-frequency signal as spurious from entering inside the multilayer dielectric substrate 20 via the surface layer. The surface-layer grounding conductor is arbitrarily connected to the carrier substrate 13 via a ground via-hole 28 or the like or an inner-layer grounding conductor (not shown) formed on an inner layer of the multilayer dielectric substrate 20. Furthermore, a plurality of ground via-holes (not shown) are arranged around the signal via-hole 24 across the dielectrics so that the signal via-hole 24 is shielded from electric fields of other signal via-holes by the plurality of ground via-holes.

Figure 3:
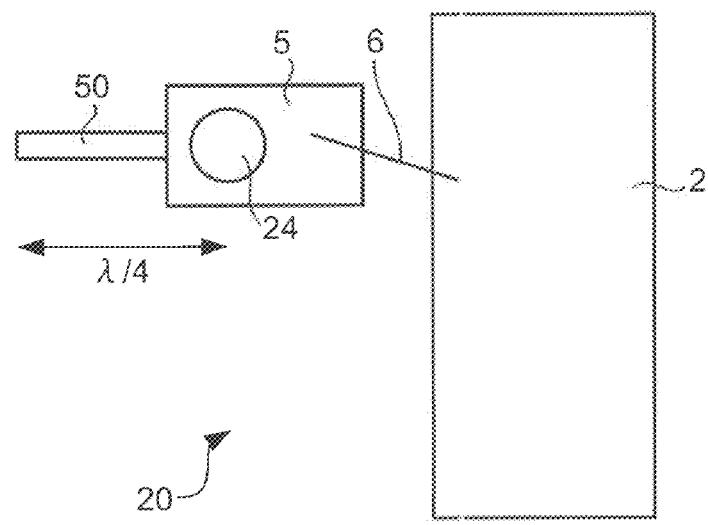
FIG. 3 is a plan view illustrating a surface layer of a multilayer dielectric substrate in the radio-frequency package.
Figure 4:
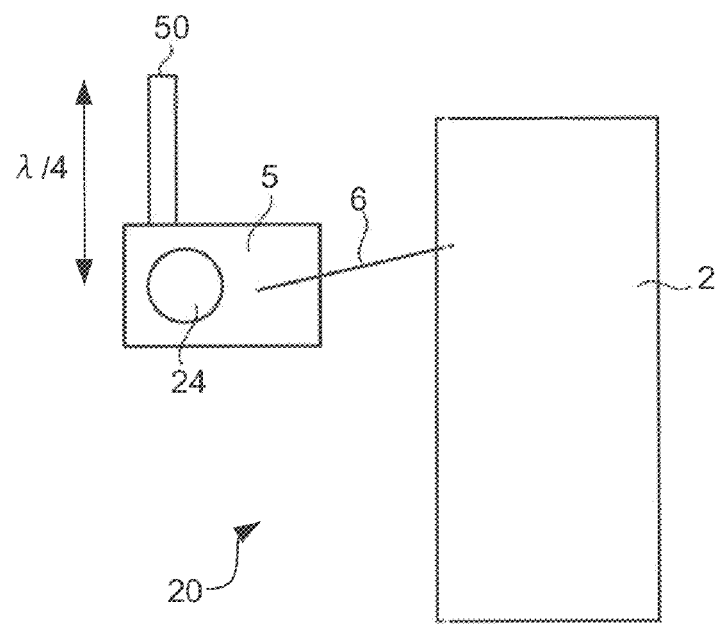
FIG. 4 is a plan view illustrating another example of the surface layer of the multilayer dielectric substrate in the radio-frequency package.

Subsequently, a main part in the present embodiment is explained below with reference to FIGS. 3 and 4. FIGS. 3 and 4 are plan views illustrating the surface layer of the multilayer dielectric substrate 20 in a condition that the cover 4 is removed. As shown in FIGS. 3 and 4, a leading-end open line 50 is provided to the internal conductor pad 5 connected to the radio-frequency device 2 by the wire 6 so as to extend on the surface layer of the multilayer dielectric substrate 20. The leading-end open line 50 has a length equivalent to substantially a quarter of a wavelength $\lambda$ of a radio-frequency signal used in the radio-frequency device 2, i.e., a length equivalent to substantially a quarter of a wavelength $\lambda$ of spurious emission in the cavity. In other words, the leading-end open line 50 having a length from the signal via-hole 24 that is equivalent to substantially a quarter of a wavelength $\lambda$ of spurious is connected to the internal conductor pad 5 so that the signal via-hole 24 connected to the internal conductor pad 5 is a short point. An extending direction of the leading-end open line 50 is arbitrary as shown in FIGS. 3 and 4.

The spurious emission from the radio-frequency device 2 propagates through inside the cavity. In conventional technologies, there is a problem that such spurious emission is coupled to the wire 6 connecting between the internal conductor pad 5 and the radio-frequency device 2, and as indicated by a dashed line shown in FIGS. 1 and 2, propagates, for example, along a bias line composed of the inner-layer signal line 23, the signal via-hole 22, and the external conductor pad 21 via the internal conductor pad 5 and the signal via-hole 24, and then radiates to the outside.

To avoid such a problem, in the present embodiment, the leading-end open line 50 in length of $\lambda/4$ is connected to the internal conductor pad 5. Therefore, the spurious emission coupled to the wire 6 can be reflected by the leading-end open line 50, and thus it is possible to suppress leakage of the spurious emission to the outside via the inner-layer signal line 23, the signal via-hole 22, and the external conductor pad 21. Consequently, out of the spurious emission propagating through inside the cavity, a level of spurious emission coupled to the wire 6 can be reduced by providing the leading-end open line 50, and also it is possible to fulfill EMI characteristics regulated by the Radio Law.

Figure 5:
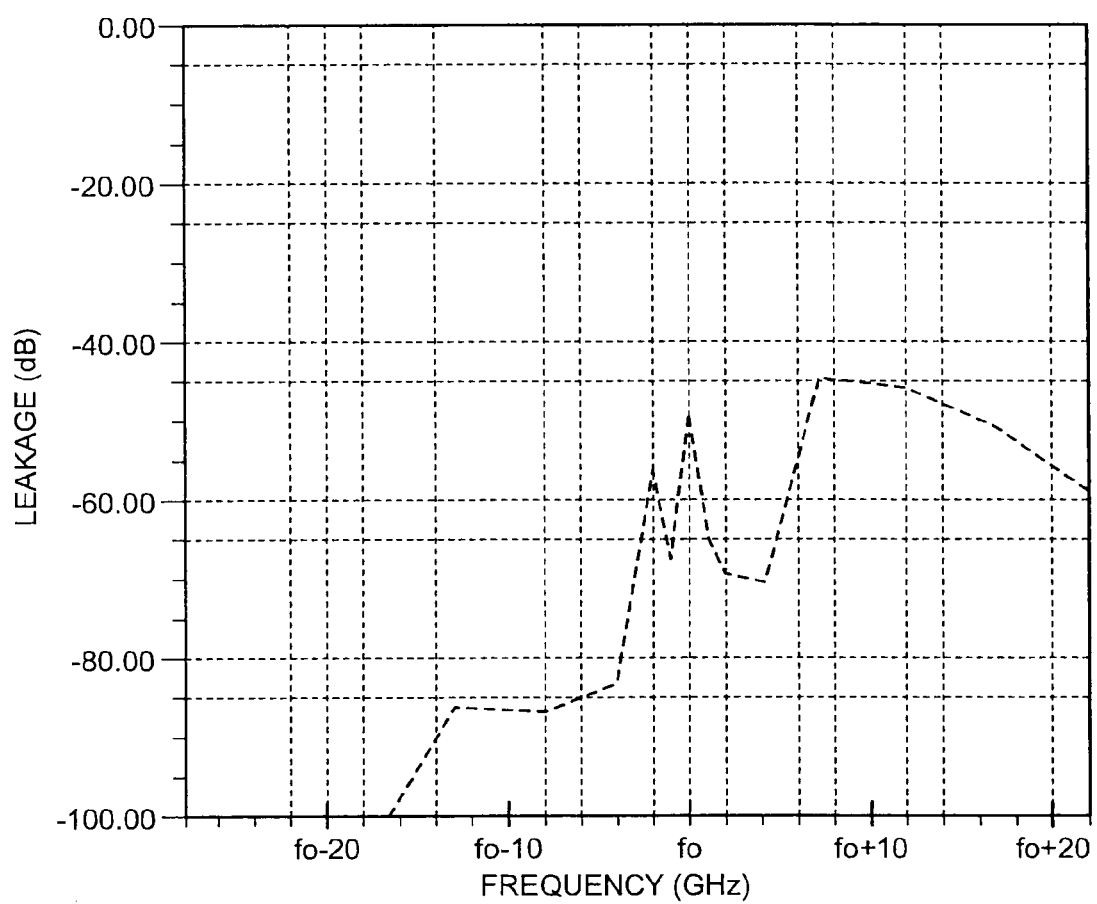
FIG. 5 is a diagram illustrating characteristics of a simulation of a level of spurious leaking to the outside, and a diagram illustrating the characteristics in a case where a leading-end open line is not provided.
Figure 6:
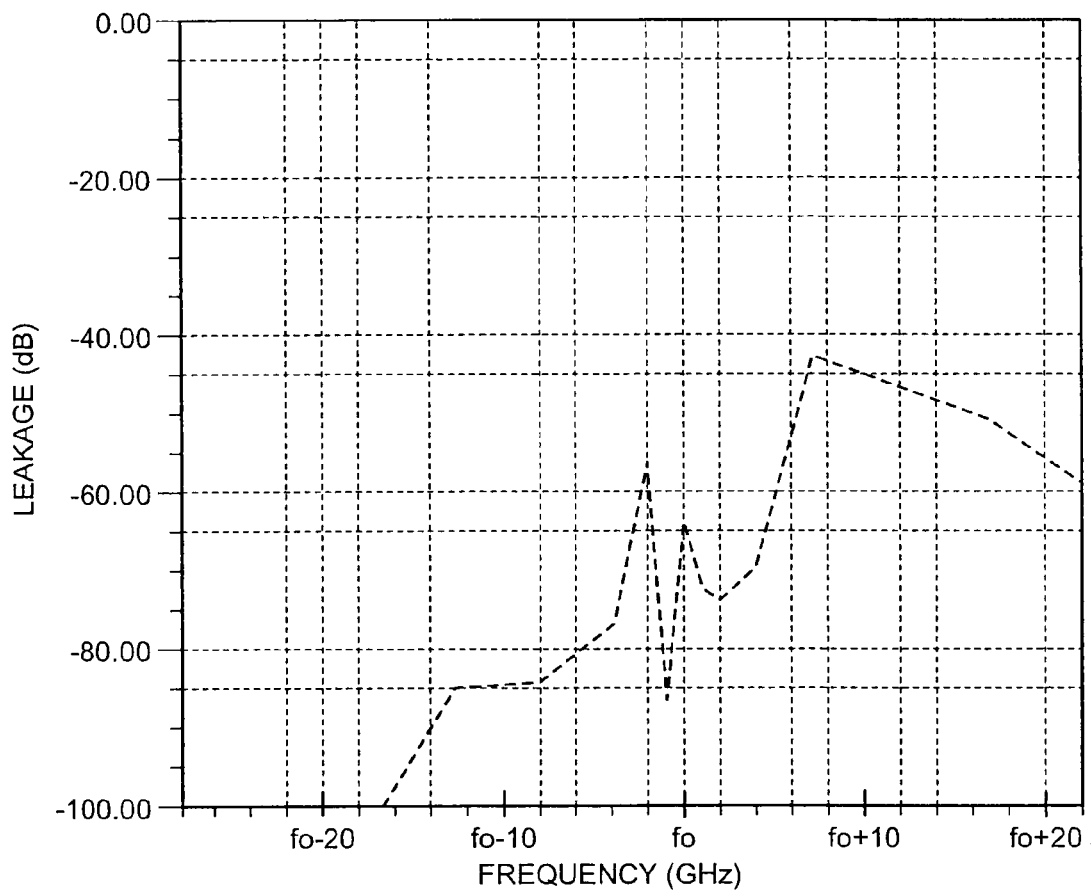
FIG. 6 is a diagram illustrating characteristics of a simulation of a level of spurious leaking to the outside, and a diagram illustrating the characteristics in a case where the leading-end open line is provided.

FIGS. 5 and 6 show characteristics of simulations of a level of leakage of spurious to the outside when a length of the wire 6 is $\lambda/4$, i.e., characteristics of simulations of passage of a radio-frequency component in an area between the wire 6 and the external conductor pad 21. In the simulation shown in FIG. 5, the leading-end open line 50 is not provided. On the other hand, in the simulation shown in and FIG. 6, the leading-end open line 50 in length of $\lambda/4$ is provided. In FIGS. 5 and 6, fo indicates a frequency of the spurious emission.

As is evident from results of these simulations, when the leading-end open line 50 is not provided, as shown in FIG. 5, a level of the spurious emission frequency fo leaking to the outside was −50 dB. On the other hand, when the leading-end open line 50 is provided, as shown in FIG. 6, a level of the spurious emission frequency fo leaking to the outside was −64 dB. In other words, when the leading-end open line 50 is provided, a band-stop filter functions, so that a level of passage of the radio-frequency component can be extremely reduced in a band near the frequency fo corresponding to a spurious frequency $\lambda$. Therefore, it is possible to suppress passage of spurious coupled to the wire 6 through the leading-end open line 50 ahead. Thus, it is possible to suppress leakage of a radio-frequency component to the outside.

Incidentally, in the above embodiment, as the electromagnetic shield member composing the cavity, the seal ring 3 and the cover 4, which are separate parts, are employed. Alternatively, as the electromagnetic shield member, a cap member that the seal ring 3 and the cover 4 are integrally molded thereinto can be employed.

In this manner, according to the embodiment, the leading-end open line having the length equivalent to substantially a quarter of a wavelength of spurious coupled to the wire 6 is provided to the internal conductor pad 5 for bias/control signal, so that the spurious coupled to the wire 6 is reflected by the leading-end open line provided to the internal conductor pad. Therefore, it is possible to reduce a level of spurious coupled to the wire 6, and thus it is possible to reduce a level of spurious leaking to the outside. Consequently, it is possible to suppress leakage of spurious to outside the radio-frequency package reliably. In this manner, within the radio-frequency package, leakage of a radio-frequency component to outside the radio-frequency package can be suppressed, so that it is possible to reduce a production cost.

Industrial Applicability

As described above, the radio-frequency package according to the present invention is useful as a radio-frequency package that a radio-frequency device operating in a microwave band or a millimeter-wave band is mounted in an electromagnetic shield space thereof.

The invention claimed is:

1. A radio-frequency package comprising:
a radio-frequency device configured to emit a radio-frequency signal at a predetermined wavelength;
a multilayer dielectric substrate having a top surface layer on which the radio-frequency device is mounted; and
an electromagnetic shield member that covers a portion of the top surface layer of the multilayer dielectric substrate and the radio-frequency device,
wherein the multilayer dielectric substrate includes
an internal conductor pad for bias/control signal arranged on the top surface layer of the multilayer dielectric substrate inside the electromagnetic shield member, the internal conductor pad being separate from the radio-frequency device and directly wire-connected to the radio-frequency device,
a first signal via-hole connected to the internal conductor pad and arranged inside the electromagnetic shield member,
an external conductor pad for bias/control signal arranged outside the electromagnetic shield member,
a second signal via-hole connected to the external conductor pad and arranged outside the electromagnetic shield member, and
an inner-layer signal line that connects between the first signal via-hole and the second signal via-hole, and
the internal conductor pad includes a leading-end open line arranged on the top surface layer of the multilayer dielectric substrate having a length of substantially a quarter of the predetermined wavelength of the radio-frequency emitted by the radio-frequency device.

2. The radio-frequency package according to claim 1, wherein the leading-end open line extends a length of substantially a quarter of the wavelength of the radio-frequency signal from the first signal via-hole.

3. The radio-frequency package according to claim 1, wherein the leading-end open line is connected to the internal conductor pad at the top surface layer and is arranged inside the electromagnetic shield member.

* * * * *